United States Patent
Amador et al.

(12) 
(10) Patent No.: US 6,750,134 B2
(45) Date of Patent: Jun. 15, 2004

(54) VARIABLE CROSS-SECTION PLATED MUSHROOM WITH STUD FOR BUMPING

(75) Inventors: Gonzalo Amador, Dallas, TX (US); Diane Louise Arbuthnot, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/339,377

(22) Filed: Jan. 9, 2003

(65) Prior Publication Data

US 2003/0129823 A1 Jul. 10, 2003

Related U.S. Application Data

(60) Provisional application No. 60/346,394, filed on Jan. 9, 2002.

(51) Int. Cl.[7] .............................................. H01L 21/44
(52) U.S. Cl. ....................................................... 438/613
(58) Field of Search ................................. 438/613, 638, 438/666; 228/180.22; 361/767, 760, 777, 768; 174/263

(56) References Cited

U.S. PATENT DOCUMENTS

| | | | | |
|---|---|---|---|---|
| 4,742,023 A | * | 5/1988 | Hasegawa | 438/614 |
| 5,523,920 A | * | 6/1996 | Machuga et al. | 361/767 |
| 6,194,667 B1 | * | 2/2001 | Jimarez et al. | 174/261 |
| 6,372,622 B1 | * | 4/2002 | Tan et al. | 438/612 |

* cited by examiner

*Primary Examiner*—David A. Zarneke
(74) *Attorney, Agent, or Firm*—Bret J. Petersen; W. James Brady, III; Frederick J. Telecky, Jr.

(57) ABSTRACT

An improved bump fabrication process is described that produces a larger diameter/taller solder ball than with a standard mushroom by forming an elongated mushroom having a short axis in the direction of adjacent connection mushrooms and an elongated axis orthogonal to the short axis. The increased larger volume solder when reflowed produces the larger diameter/taller bolder ball bump.

9 Claims, 4 Drawing Sheets

VARIABLE CROSS-SECTION PLATED MUSHROOM WITH STUD FOR BUMPING

This application claims priority under 35 USC 119(e)(1) of provisional application No. 60/346,394 filed Jan. 9, 2002.

FIELD OF INVENTION

This invention relates to semiconductor devices and in particular to putting solder balls on semiconductor chips for connection onto a wafer.

BACKGROUND OF INVENTION

As die sizes decrease with more components ( e.g., circuits, transistors, or the like) to provide more functions there are more connection points closer together. The distance between the connection points or the pitch becomes increasingly smaller as the die sizes decrease. Wire bonding of the connection points is used where these connection points are close together. It is highly desirable to provide solder bumps of larger and taller size to enable these chips to be directly connected to a substrate, package or circuit assembly without wire bonding. It is highly desirable to provide a solder ball on the die with as large a diameter and as high a height as possible without bridging the other solder balls to facilitate connections thereto. With a conventional circular resist defined, electroplated solder bump, the volume of plated solder and the resulting reflowed solder bump height is limited by the pitch of the product. The pitch is the distance from the center of one bump to the center of an adjacent bump.

SUMMARY OF INVENTION

In accordance with one embodiment of the present invention a variable cross-section plated mushroom with stud will allow the bumping of a larger diameter, taller bump on a tight pitch product.

DESCRIPTION OF PREFERRED EMBODIMENTS OF THE PRESENT INVENTION

Figure 1:
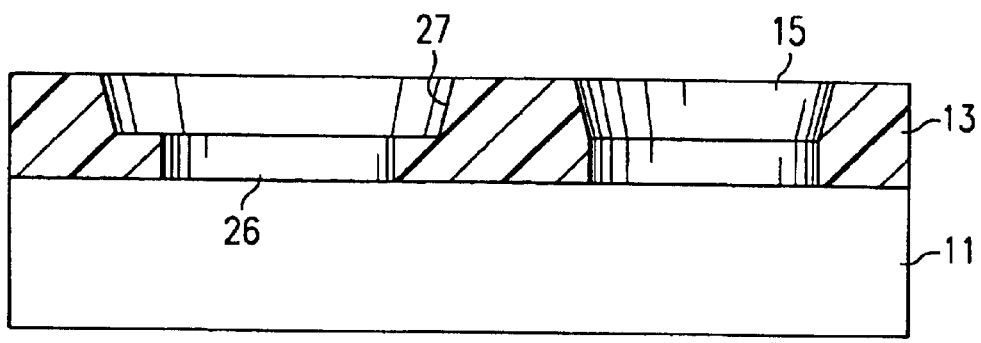
FIG. 1 illustrates side by side a die surface with photoresist well according to the prior art on the right and photoresist well-double exposure according to one embodiment of the present invention on the left.

Referring to FIG. 1 there is illustrated a die 11 having on the top surface a photoresist layer 13. On the right is a conventional photoresist well 15 for forming a conventional reflowed solder bump. The photoresist well 15 on the right is a conventional well using a single exposure for a copper stud and plated solder mushroom with the copper stud and plated solder mushroom shaft having approximately the same diameter. On the left is a photoresist well 25 according to an embodiment of the present invention to produce a higher aspect ratio plated mushroom where the resulting reflowed bump is larger without shorting to the adjacent bump. The aspect ratio is higher with respect to the lateral direction toward the adjacent bump. It requires a double exposure with a first exposure through for the copper stud 26 and a second exposure at blind depth for additional solder plating 27.

Figure 2:
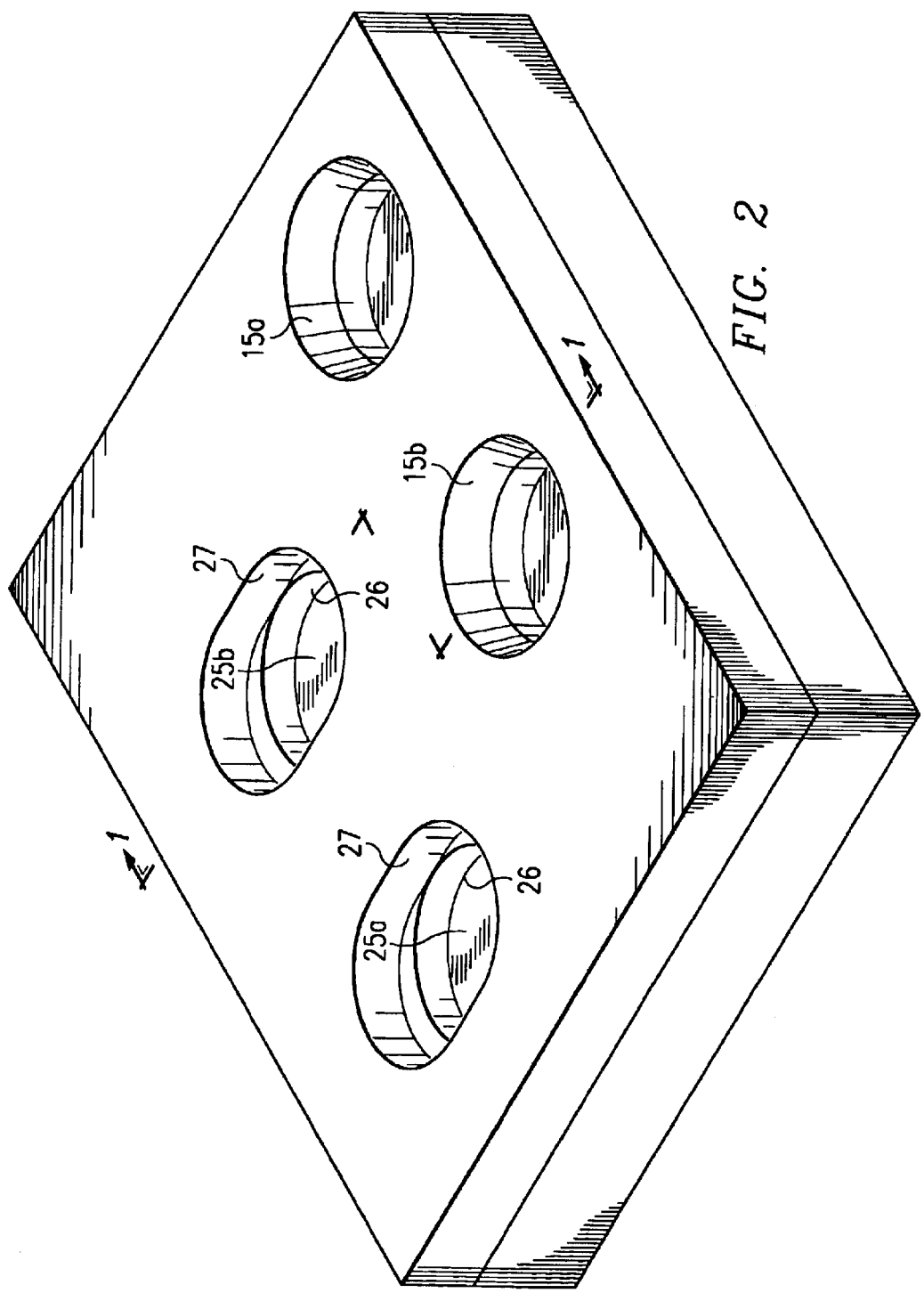
FIG. 2 is an off-axis view showing side by side the conventional resist well on the right and multi-cross sectioned resist well according to one embodiment of the present invention on the left.

The conventional well 15 is mostly circular and is illustrated on the right by the two wells 15a and 15b in the off-axis view of FIG. 2. The well 25 according to one embodiment of the present invention has a circular portion 26 for a copper stud region and has a high aspect ratio shape portion 27 that is elliptical for the plating region 27 as illustrated by the two wells 25a and 25b. The short axis is in the direction of the closest adjacent wells or solder mushrooms or between the two wells 25a and 25b. The long axis is in the direction orthogonal to the short axis. The fabrication will use a stepper and a multi-field reticle to pattern thick resist to plate a variable cross section mushroom. The process involves multiple layers of photolithography to create the variable cross-sectioned well. The first step for the stud may be made by a first exposure set for a deep depth and set for a round focus for the stud region and then set for a shallower depth at an elliptical focus. There are many other ways to provide the stepped well of round and then elliptical shape.

Figure 3:
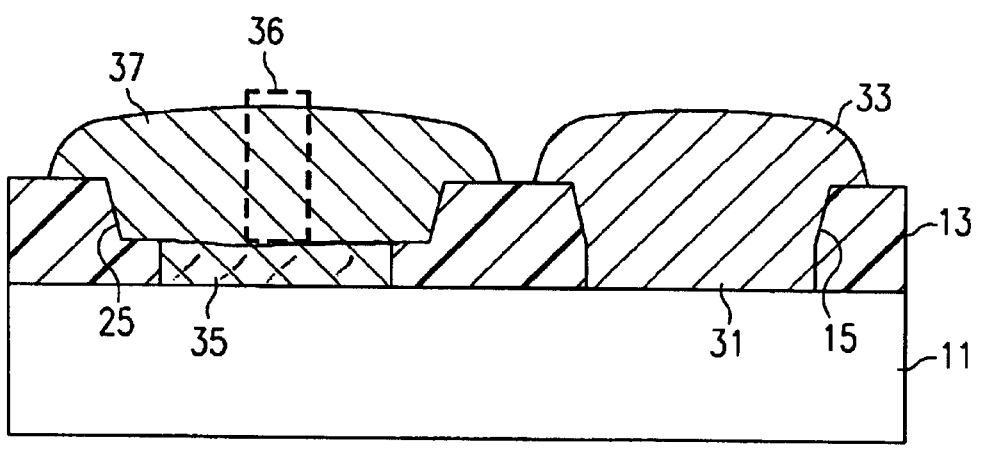
FIG. 3 illustrates side by side a conventional photoresist well with plated copper stud and solder mushroom on the right and a photoresist well with plated copper stud and solder mushroom according to one embodiment of the present invention on the left.

Referring to FIG. 3 there is shown at the right a conventional copper stud 31 and solder mushroom 33 electroplated in the well 15. When the solder is plated, it fills the well forming the stem of the mushroom. Once the well is filled, the solder "overplates" onto the resist surface forming the cap of the mushroom. On the left side of FIG. 3 is shown the copper stud 35 and the elongated electroplated solder mushroom 37 in the photoresist well 25 according to one embodiment of the present invention. The dashed area 36 represents the additional solder enabled by the unique resist well design. Other variable cross-section shapes may be used to increase the volume of electroplated solder mushroom such as a fan shape or a diamond shape with the minor axis in the direction of the adjacent mushrooms.

Figure 4:
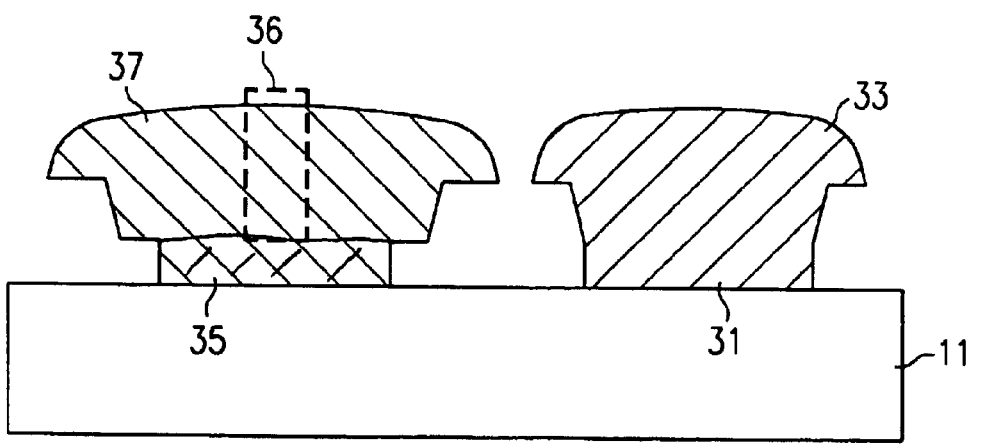
FIG. 4 illustrates side by side conventional plated copper studs and solder mushrooms with photo resist stripped off on the right and solder mushrooms plated copper studs and solder mushrooms with photo resist stripped off according to one embodiment of the present invention on the left.

FIG. 4 illustrates the identical copper studs 31 and 35 but different solder mushrooms 33 and 37 of FIG. 3 with the photoresist removed. The solder mushrooms 35 and 37 are ready for reflow.

Figure 5:
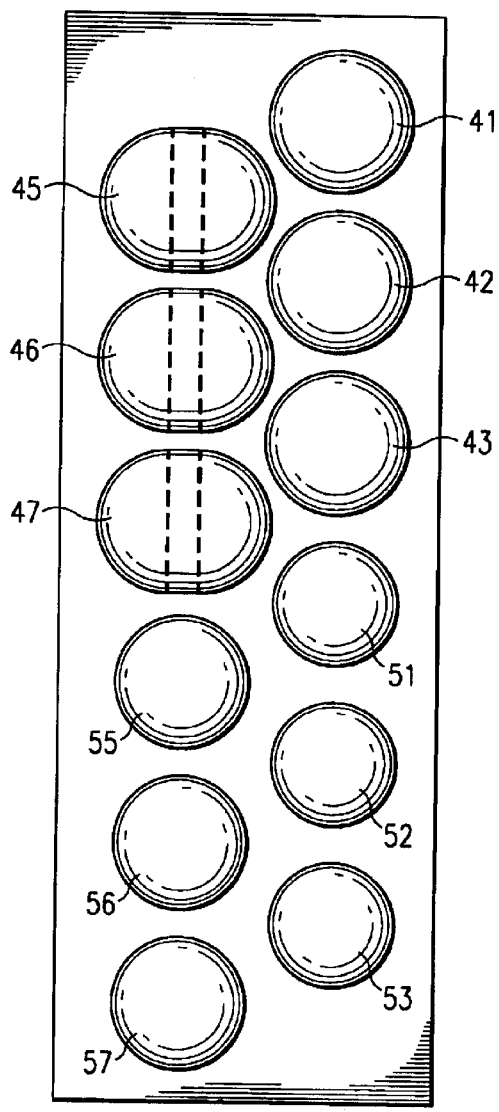
FIG. 5 is a top view of die showing prior art plated solder mushrooms on the upper right and resulting reflowed solder bumps on the lower right and solder mushrooms according to one embodiment of the present invention on the upper left and resulting reflowed solder bumps on the lower left.
Figure 6:
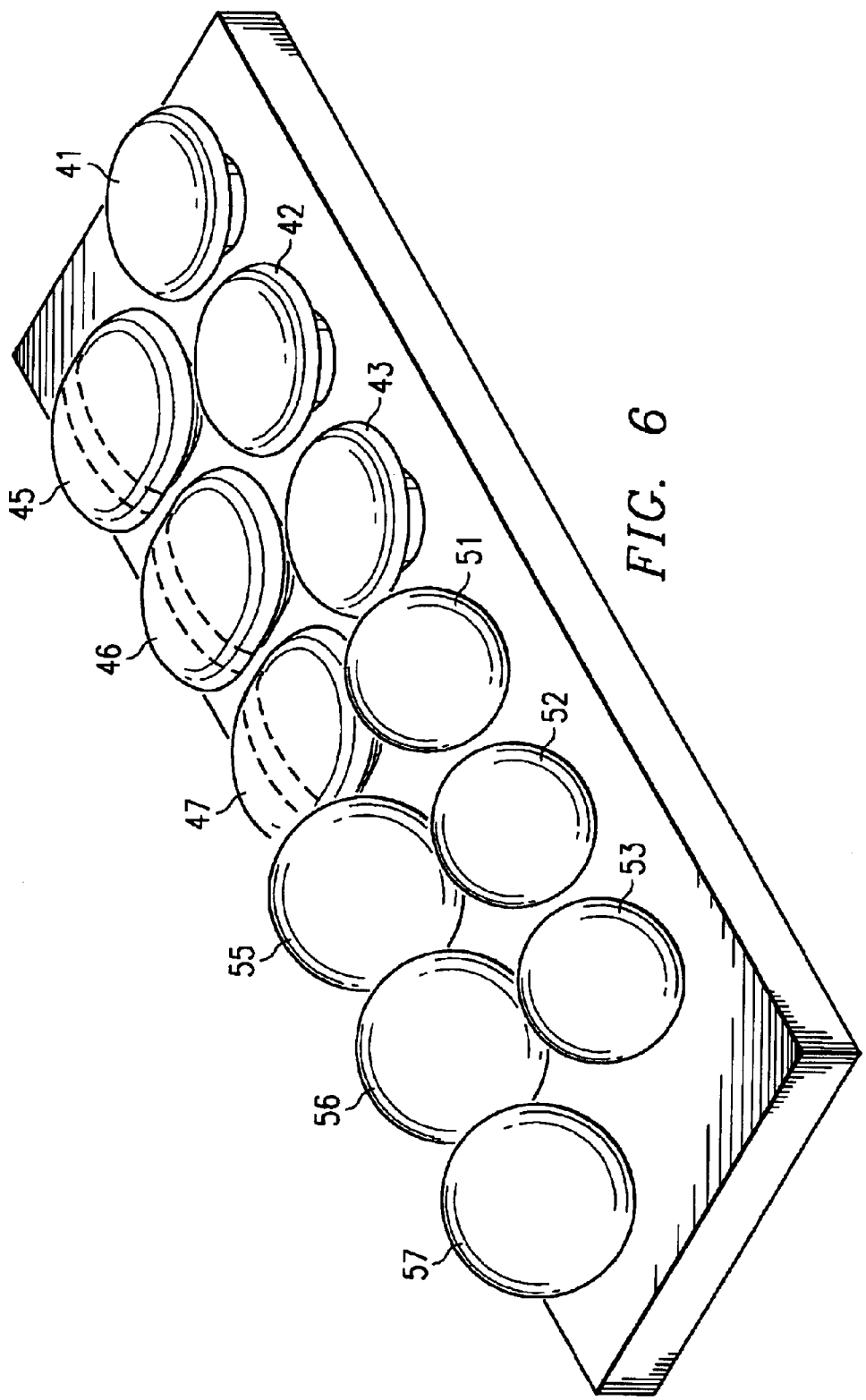
FIG. 6 is an off-axis view of die showing prior art plated solder mushrooms on the upper right and resulting reflowed solder bumps on the lower right and solder mushrooms according to one embodiment of the present invention on the upper left and resulting reflowed solder bumps on the lower left.

FIG. 5 is a top view and FIG. 6 is an off axis view of plated solder mushrooms 41–43 of conventional type on the upper right and plated, high aspect ratio solder mushrooms 45–47 of the type according to an embodiment of the present invention on the upper left. The solder mushrooms are heated and reflowed to form the solder balls. Upon reflow, the solder will collapse into a spherical shape. On the lower right are the reflow solder balls 51–53 resulting from heating the mushrooms 41–43. Plating of the conventional circular mushroom in tight pitch product is limited by the pitch of the pads or the spacing between the centers of the bond pads. On the lower left are the reflow solder balls 55–57 resulting from heating the elongated mushrooms 45–47. The additional volume of solder enables by the elongated mushroom results in a spherical shape that is larger and taller than the conventional solder ball even though the pitch is the same.

The size and direction of the ellipse permit the same spacing between the centers of the solder balls. Other shapes are possible within the scope of the present invention. The direction of the elongated axis or a spur from the center is in a direction away the closest solder ball.

Figure 7:
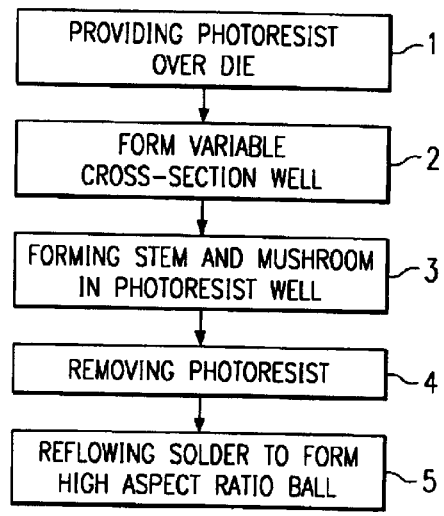
FIG. 7 is a flow chart of the process according to one embodiment of the present invention.

FIG. 7 illustrates the steps according to one embodiment of the present invention. The first step is providing a photoresist over a die. The second step is forming multiple layers of photolithography to provide a variable cross-section well including a circular portion for a stud and an elliptical portion or other such noncircular shape in the direction away from the adjacent wells. The third step is forming a copper stem in the circular portion and electroplating the solder mushroom in the elliptical portion in the well of the photoresist. The fourth step is removing the photoresist. The fifth step is reflowing the solder mushroom to form the solder ball.

The present invention involves modifying a standard bump fabrication process that involves photolithography and electroplating to produce an improved larger bump. The process allows for plating of tighter pitch wire bond or bump product. Plating of standard circular mushroom on tight pitch product is limited by the pitch of the target pads. The major diameter of the circular mushroom can not be any greater than the bump pitch. With the variable cross sectioned plated mushroom, the photolithography well into which the mushroom is plated can be designed to have an aspect ratio greater than 1. That is the height to width in the direction of adjacent balls is greater than 1. As an example, the elongated mushroom well can be designed so that the minor limiting dimension of the mushroom is the wire bond pad or bump pitch but the major dimension is greater than this pitch thus allowing a greater volume of solder to be plated. Upon reflow, the solder will collapse into a spherical shape. The additional volume of solder enabled by the elongated mushroom will result in a larger/taller reflowed solder bump.

While the invention has been described in the context of preferred embodiments, it will be apparent to those skilled in the art that the present invention may be modified in other ways and may assume many embodiments other than that specifically set out and described above. Accordingly various modifications can be made without departing from the scope of the invention.

What is claimed is:

1. A method of forming a larger/taller solder bump on a tight pitch connection product limited by the pitch of the connection pads comprising the steps of:

forming an elongated plated solder mushroom with a variable cross section so the minor dimension of the mushroom is in the direction of the connection pad pitch and the major dimension is orthogonal to the minor dimension and is greater than the pitch allowing a greater volume of solder to be plated and reflowing said elongated mushroom with variable cross-section to provide a larger diameter/taller solder bump within the pitch of the connection pads than with a circular mushroom.

2. The method of claim 1 including the step of forming a stem of copper before forming a plated solder mushroom.

3. The method of claim 2 wherein said stem is circular.

4. The method of claim 3 wherein said elongated plated mushroom is elliptical.

5. The method of claim 1 wherein said elongated plated mushroom is elliptical.

6. A method of forming a larger diameter/taller solder bump on a tight pitch connection product limited by the pitch of the connection pads comprising the steps of:

forming a well in photoresist by photolithography for a circular stud and for an elongated plated solder mushroom with a variable cross section so the minor dimension of the mushroom is in the direction of the connection pad pitch and the major dimension is orthogonal the minor dimension, electroplating an elongated mushroom in said well, removing said photoresist, and reflowing the elongated mushroom to provide a larger diameter/taller solder ball within the pitch of the connection pads than with a circular mushroom.

7. The method of claim 6 including the step of forming said circular stud.

8. The method of claim 7 wherein said circular stud is copper.

9. The method of claim 6 wherein said elongated mushroom is elliptical.

* * * * *